(12) United States Patent
Kim

(10) Patent No.: US 11,988,914 B2
(45) Date of Patent: May 21, 2024

(54) DISPLAY DEVICE

(71) Applicant: LG ELECTRONICS INC., Seoul (KR)

(72) Inventor: Hyoungkyu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/802,002

(22) PCT Filed: Feb. 24, 2020

(86) PCT No.: PCT/KR2020/002640
§ 371 (c)(1),
(2) Date: Aug. 24, 2022

(87) PCT Pub. No.: WO2021/172606
PCT Pub. Date: Sep. 2, 2021

(65) Prior Publication Data
US 2023/0094521 A1 Mar. 30, 2023

(51) Int. Cl.
*G02F 1/1333* (2006.01)
*H05K 7/20* (2006.01)

(52) U.S. Cl.
CPC .. *G02F 1/133385* (2013.01); *G02F 1/133314* (2021.01); *H05K 7/20972* (2013.01)

(58) Field of Classification Search
None
See application file for complete search history.

(56) References Cited

U.S. PATENT DOCUMENTS

| | | | |
|---|---|---|---|
| 2012/0281161 A1* | 11/2012 | Hubbard | G02F 1/133382 165/104.34 |
| 2014/0085866 A1 | 3/2014 | Shirai | |
| 2014/0125914 A1* | 5/2014 | Fujita | B60K 35/00 349/60 |
| 2014/0345834 A1* | 11/2014 | Dunn | H05K 7/20972 165/120 |
| 2015/0009419 A1* | 1/2015 | Hosoki | G02B 6/0033 362/613 |
| 2016/0198589 A1* | 7/2016 | Kang | G02F 1/133385 361/692 |
| 2016/0265759 A1* | 9/2016 | Na | G02F 1/133602 |
| 2020/0012143 A1* | 1/2020 | Wang | G02F 1/133385 |
| 2020/0285099 A1* | 9/2020 | Wang | G02F 1/133385 |

FOREIGN PATENT DOCUMENTS

| | | |
|---|---|---|
| CN | 104808389 A | 7/2015 |
| KR | 10-2016-0084279 A | 7/2016 |
| KR | 10-2016-0109918 A | 9/2016 |
| KR | 10-2117578 B1 | 6/2020 |

* cited by examiner

*Primary Examiner* — Ryan Crockett
(74) *Attorney, Agent, or Firm* — Birch, Stewart, Kolasch & Birch, LLP

(57) ABSTRACT

Disclosed is a display device. The display device of the present disclosure includes a display panel; a module cover located at a rear of the display panel; a back cover located at a rear of the module cover, and coupled to the module cover; a board coupled to the module cover between the module cover and the back cover, and having a plurality of input/output units; and a bracket covering a portion of the board adjacent to the plurality of input/output units, wherein a distal end of the back cover is adjacent to the bracket.

9 Claims, 16 Drawing Sheets

DISPLAY DEVICE

CROSS REFERENCE TO RELATED APPLICATION

This application is the National Phase of PCT International Application No. PCT/KR2020/002640, filed on Feb. 24, 2020, which is hereby expressly incorporated by reference into the present application.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

In addition, many studies have been accomplished on a structure that can effectively remove heat generated by displaying a high-quality image in a large-screen ultra-thin display device.

For example, a fan built into a display device may cause a flow of air to cool a heating element such as a PCB. Accordingly, damage or deterioration of the display device due to heat can be prevented.

DISCLOSURE OF INVENTION

Technical Problem

An object of the present disclosure is to solve the above and other problems.

Another object of the present disclosure may be to provide a display device capable of cooling a PCB coupled to a module cover by using an air flowing by a fan.

Another object of the present disclosure may be to provide a display device capable of providing a flow path of air flowing by a fan to a module cover without having a separate structure.

Another object of the present disclosure may be to provide a display device capable of forming a flow path of air flowing by a fan in correspondence with a position of a PCB coupled to a module cover.

Technical Solution

According to an aspect of the present disclosure for achieving the above object, there is provided a display device including: a display panel; a module cover located at a rear of the display panel; a plate located between the display panel and the module cover; a back cover covering a back of the module cover; a PCB coupled to the module cover between the module cover and the back cover, and on which a plurality of electronic elements are located; and a fan adjacent to the PCB, and causing a flow of air, wherein the module cover includes: a body to which the fan is coupled; and an air tunnel formed at the body, and providing a flow path through which the air flowed by the fan is sucked in or discharged.

Advantageous Effects

The effect of the display device according to the present disclosure will be described as follows.

According to at least one of embodiments of the present disclosure, it is possible to provide a display device capable of cooling a PCB coupled to a module cover by using an air flowing by a fan.

According to at least one of the embodiments of the present disclosure, it is possible to provide a display device capable of providing a flow path of air flowing by a fan to a module cover without having a separate structure.

According to at least one of the embodiments of the present disclosure, it is possible to provide a display device capable of forming a flow path of air flowing by a fan in correspondence with a position of a PCB coupled to a module cover.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR CARRYING OUT THE INVENTION

Figure 1:
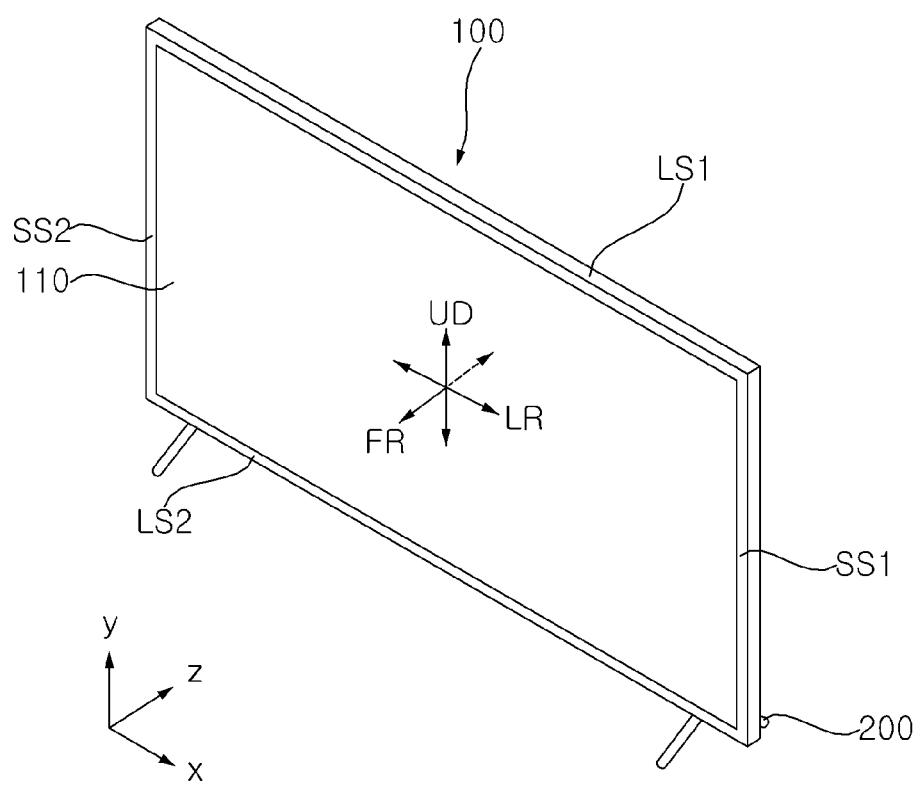
FIGS. 1 to 16 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 100 may include a display panel 110 and a stand 200. The display panel 110 may display a screen. The stand 200 may support a configuration of the display device 100 excluding the stand 200.

The display device 110 may include a first long side LS1, a second long side LS2 opposite the first long side LS1, a first short side SS1 adjacent to one end of the first long side LS1 and the second long side LS2, and a second Short Side SS2 opposite to the first short side SS1. Meanwhile, for convenience of explanation, the lengths of the first and second long sides LS1 and LS2 are illustrated and described as being longer than the lengths of the first and second short sides SS1 and SS2, but a case in which the lengths of the first and second long sides LS1 and LS2 are approximately equal to the lengths of the first and second short sides SS1 and SS2 may also be possible.

A direction parallel to the long sides LS1 and LS2 of the display device 100 may be referred to as a left-right direction LR. A direction parallel to the short sides SS1 and SS2 of the display device 100 may be referred to as an up-down direction UD. A direction perpendicular to the long sides LS1 and LS2 and the short sides SS1 and SS2 of the display device 100 may be referred to as a front-rear direction FR. Here, a direction in which the display panel 110 displays a screen may be referred to as a forward direction, and a direction opposite to this may be referred to as a rearward direction.

Hereinafter, the display device 100 having the display panel 110, which is an LCD panel, will be described as an example with reference to FIGS. 2 to 4, and a display device 100' having a display panel 110', which is an OLED panel, will be described as another example with reference to FIG. 5. However, a display device applicable to the present disclosure is not limited thereto.

Figure 2:
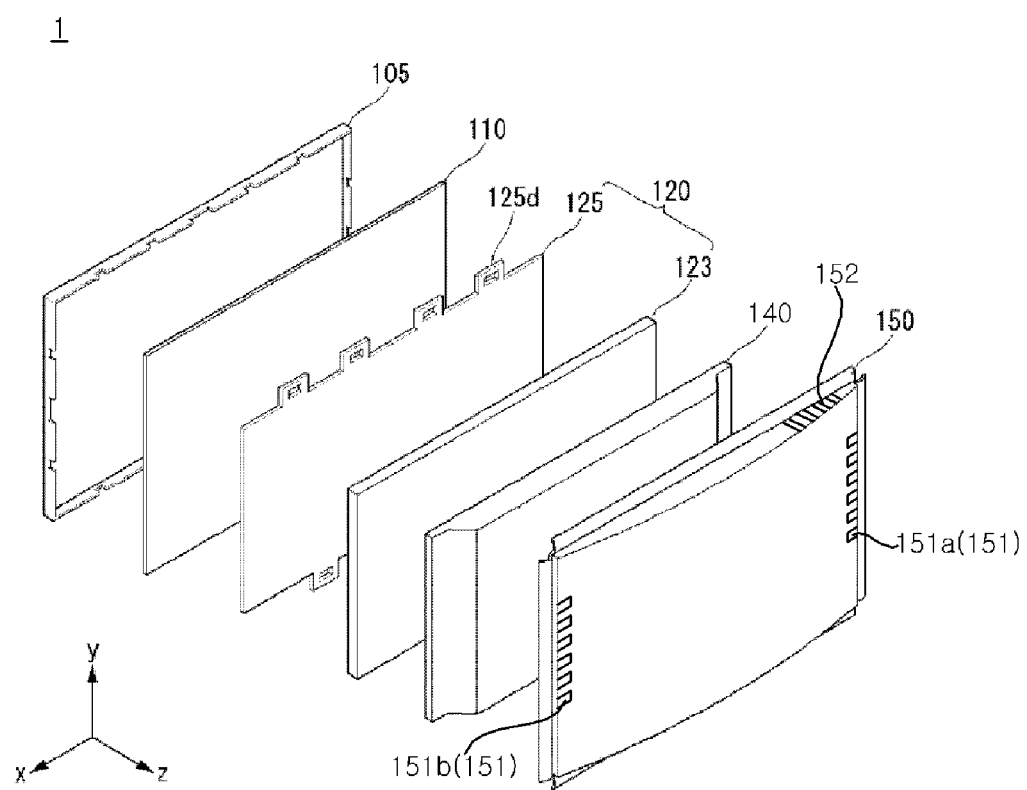

Referring to FIG. 2, the display device 100 may include a front cover 105, a backlight unit 120, a module cover 140, and a back cover 150, in addition to the display panel 110 and the stand 200. Here, the display panel 110 may be referred to as an LCD panel.

The front cover 105 may cover at least partial area of the front and side surfaces of the display panel 110. The front cover 105 may be divided into a front surface cover located on the front surface of the display panel 110 and a side surface cover located on the side surface of the display panel 110. The front surface cover and the side surface cover may be configured separately. Any one of the front surface cover and the side surface cover may be omitted.

The display panel 110 may be provided on the front surface of the display device 100 and may display an image. The display panel 110 may display an image by outputting red, green or blue (RGB) color for each pixel by a plurality of pixels according to timing. The display panel 110 may be divided into an active area in which an image is displayed and a de-active area in which an image is not displayed. The display panel 110 may include a front substrate and a rear substrate that face each other with a liquid crystal layer interposed therebetween.

The front substrate may include a plurality of pixels composed of red, green, and blue sub-pixels. The front substrate may output light corresponding to a color of red, green, or blue according to a control signal.

The rear substrate may include switching elements. The rear substrate may switch a pixel electrode. For example, the pixel electrode may change the molecular arrangement of a liquid crystal layer according to a control signal input from the outside. The liquid crystal layer may include liquid crystal molecules. The arrangement of the liquid crystal molecules may be changed according to a voltage difference generated between the pixel electrode and a common electrode. The liquid crystal layer may transmit a light provided from the backlight unit 120 to the front substrate or block the light.

The backlight unit 120 may be located in the rearward direction of the display panel 110. The backlight unit 120 may include light sources. The backlight unit 120 may be coupled to the module cover 140 in the forward direction of the module cover 140. The backlight unit 120 may be driven by a full driving method or a partial driving method such as local dimming, and impulsive. The backlight unit 120 may include an optical sheet 125 and an optical layer 123.

The optical sheet 125 may allow the light of the light source to be evenly transmitted to the display panel 110. The optical sheet 125 may be composed of a plurality of layers. For example, the optical sheet 125 may include a prism sheet, a diffusion sheet, or the like.

The optical sheet 125 may include a coupling portion 125d. The coupling portion 125d may be coupled to the front cover 105, the module cover 140, and/or the back cover 150. Alternatively, the coupling portion 125d may be coupled to a structure formed on or coupled to the front cover 105, the module cover 140, and/or the back cover 150.

The module cover 140 may be located in the rearward direction of the display panel 110. The component of the display device 100 may be supported. For example, a component such as a backlight unit 120 and a printed circuit board PCB on which a plurality of electronic elements are located may be coupled to the module cover 140. The module cover 140 may include a metal material such as an aluminum alloy.

The back cover 150 may be located on the rear surface or in the rearward direction of the display device 100. The back cover 150 may cover the rearward direction of the display panel 110. The back cover 150 may be coupled to the module cover 140 and/or the front cover 105. For example, the back cover 150 may be an injection molding made of a resin material. However, the back cover 150 may also include a metal material.

Figure 3:
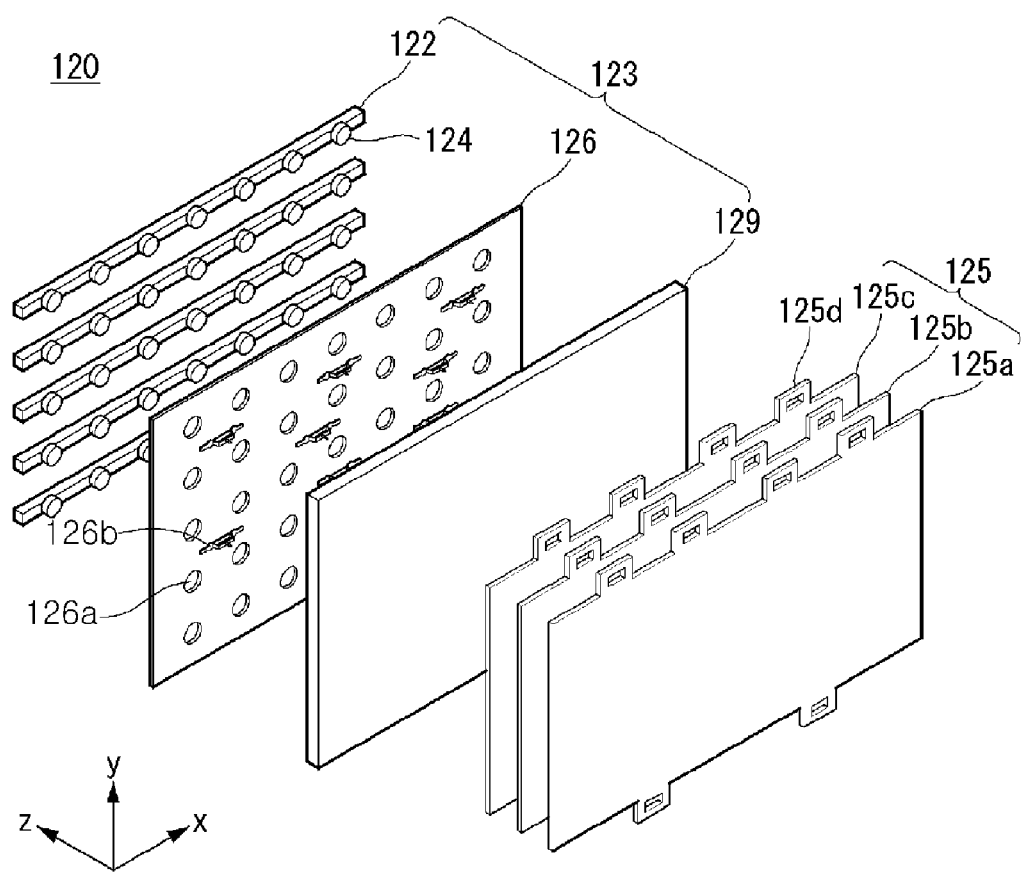

Referring to FIG. 3, the backlight unit 120 may include an optical layer 123 including a substrate 122, at least one optical assembly 124, a reflective sheet 126, and a diffusion plate 129, and an optical sheet 125 located in the forward direction of the optical layer 123.

The substrate 122 may be provided in the form of a plurality of straps that extends in the left-right direction LR and are spaced apart from each other in the up-down direction UD. At least one optical assembly 124 may be mounted on the substrate 122. An electrode pattern for connecting an adapter and the optical assembly 124 may be formed in the substrate 122. For example, a carbon nanotube electrode pattern for connecting the optical assembly 124 and the adapter may be formed in the substrate 122.

The substrate 122 may be formed of at least one of polyethylene terephthalate (PET), glass, polycarbonate (PC), and silicon. The substrate 122 may be a printed circuit board (PCB) on which at least one optical assembly 124 is mounted.

The optical assembly 124 may be a light emitting diode (LED) chip or a light emitting diode package including at least one light emitting diode chip. The optical assembly 124 may include a colored LED that emits at least one color among colors such as red, green, and blue, or may include a white LED. The colored LED may include at least one of a red LED, a green LED, and a blue LED.

The reflective sheet 126 may be located in the forward direction of the substrate 122. The reflective sheet 126 may include a plurality of through holes 126a in which the optical assembly 124 is located. The reflective sheet 126 may reflect a light which is emitted from the optical assembly 124 or is reflected from the diffusion plate 129 in the forward direction. For example, the reflective sheet 126 may include a metal having a high reflectance such as at least one of aluminum Al, silver Ag, gold Au, and titanium dioxide TiO2 and/or a metal oxide.

An air gap may be formed between the reflective sheet 126 and the diffusion plate 129. The air gap may serve as a buffer so that light emitted from the optical assembly 124 is widely spread. A supporter 126b may be located between the reflective sheet 126 and the diffusion plate 129 to form the air gap.

The diffusion plate 129 may be located in the forward direction of the reflective sheet 126. The diffusion plate 129 may be located between the reflective sheet 126 and the optical sheet 125.

The optical sheet 125 may include at least one sheet. Specifically, the optical sheet 125 may include one or more prism sheets and/or one or more diffusion sheets. The plurality of sheets included in the optical sheet 125 may be in an adhesive and/or close contact state.

The optical sheet 125 may be composed of a plurality of sheets having different functions. For example, the optical sheet 125 may include a first optical sheet 125a, a second optical sheet 125b, and a third optical sheet 125c. For example, the first optical sheet 125a may be a diffusion sheet, and the second optical sheet 125b and the third optical sheet 125c may be a prism sheet. The number and/or position of the diffusion sheet and the prism sheet may be changed. The diffusion sheet may prevent light emitted from the diffusion plate 129 from being partially concentrated, thereby making light distribution more uniform. The prism sheet may collect light emitted from the diffusion plate 129 and provide it to the display panel 110.

Figure 4:
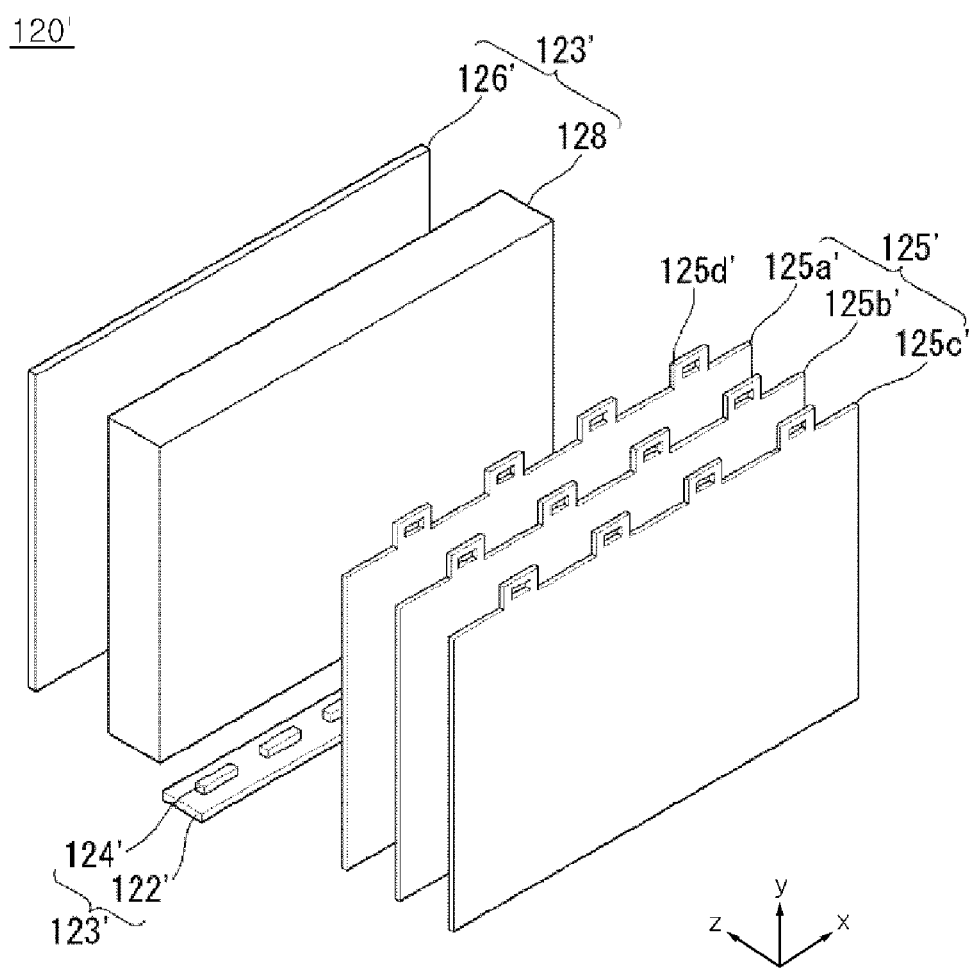

Referring to FIG. 4, the light source of the backlight unit 120' may be disposed in an edge. The backlight unit 120' may include an optical layer 123' including a substrate 122', at least one optical assembly 124', a reflective sheet 126', and a light guide plate 128, and an optical sheet 125' located in the forward direction of the optical layer 123'.

The substrate 122' extends in the left-right direction LR, and may be adjacent to a lower side of the light guide plate 128. At least one optical assembly 124' may be mounted on the substrate 122'. Accordingly, most of the light emitted from the optical assembly 124' may be transmitted to the inside of the light guide plate 128. Here, the light guide plate 128 may reflect light incident from the optical assembly 124' in the forward direction. For example, a diffusion plate 129' (not shown) may be provided on the front surface of the light guide plate 128.

The reflective sheet 126' may be located in the rearward direction of the light guide plate 128. The reflective sheet 126' may reflect a light which is emitted from the optical assembly 124' or is reflected from the light guide plate 128 in the forward direction.

An air gap may be formed between the light guide plate 128 and the optical sheet 125'. The air gap may serve as a buffer so that light emitted from the optical assembly 124' spreads widely.

The optical sheet 125' may be located in the forward direction of the light guide plate 128. The rear surface of the optical sheet 125' may be in close contact with the light guide plate 128, and the front surface of the optical sheet 125' may be in close contact with the rear surface of the display panel 110.

A coupling portion 125d' may be formed in at least one of corners of the optical sheet 125'. The coupling portion 125d' may be formed in at least one of a first optical sheet 125a', a second optical sheet 125b', and a third optical sheet 125c'.

Figure 5:
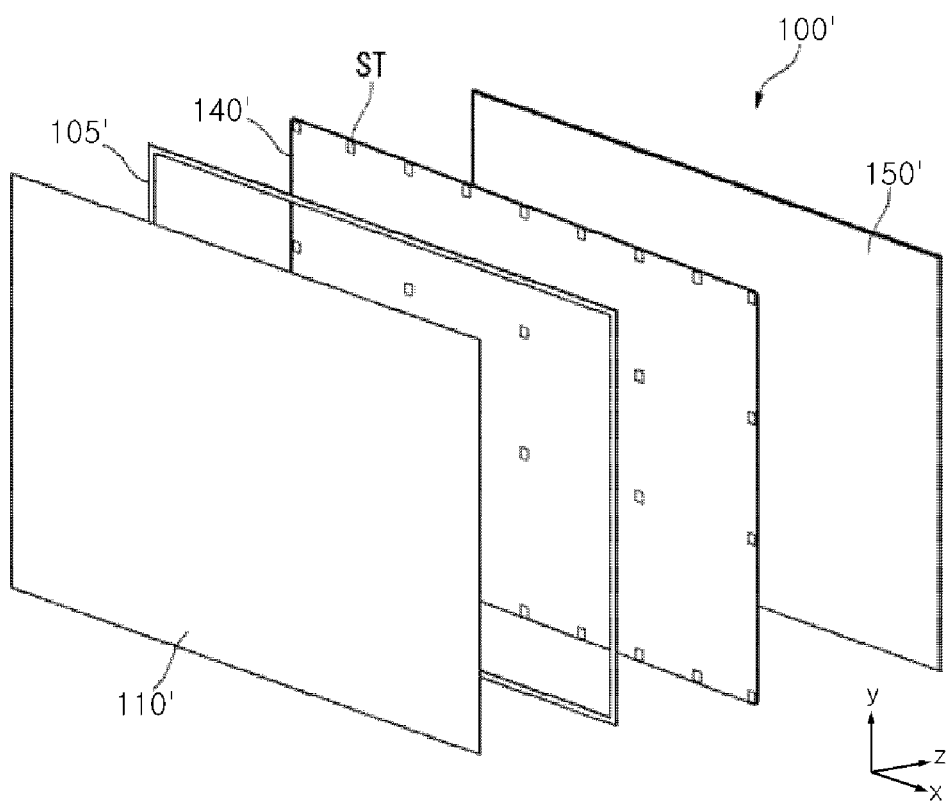

Referring to FIG. 5, unlike the above-described embodiments, the display device 100' may include a display panel 110', a middle frame 105', a module cover 140', and a back cover 150'. Here, the display panel 110' may be referred to as an OLED panel, and there is an advantage in that such a display device 100' can be implemented in an ultra-thin shape as it does not require a backlight unit.

The display panel 110' may form a front surface of the display device 100' and may display an image in the forward direction. The display panel 110' divides an image into a plurality of pixels and outputs an image by matching color, brightness, and saturation for each pixel. The display panel 110' may be divided into an active area in which an image is displayed and a de-active area in which an image is not displayed. The display panel 110' may generate a light corresponding to a color of red, green, or blue according to a control signal.

The middle frame 105' may form a side surface of the display device 100'. The middle frame 105' may be located in the rearward direction of the display panel 110, and the display panel 110' may be coupled thereto. The middle frame 105' may have a rectangular ring shape as a whole. For example, the middle frame 105' may include a metal material. Accordingly, the middle frame 105' may improve the torsional and/or bending rigidity of the display device 100'.

The module cover 140' may be coupled to the middle frame 105' in the rearward direction of the middle frame 105'. A printed circuit board (PCB) on which a plurality of electronic elements are located may be coupled to the module cover 140'.

The back cover 150' may be coupled to the module cover 140' in the rearward direction of the module cover 140'. The back cover 150' may form a rear surface of the display device 100'. For example, the back cover 150' may be an injection molding made of a resin material. However, the back cover 150' may also include a metal material.

Figure 6:
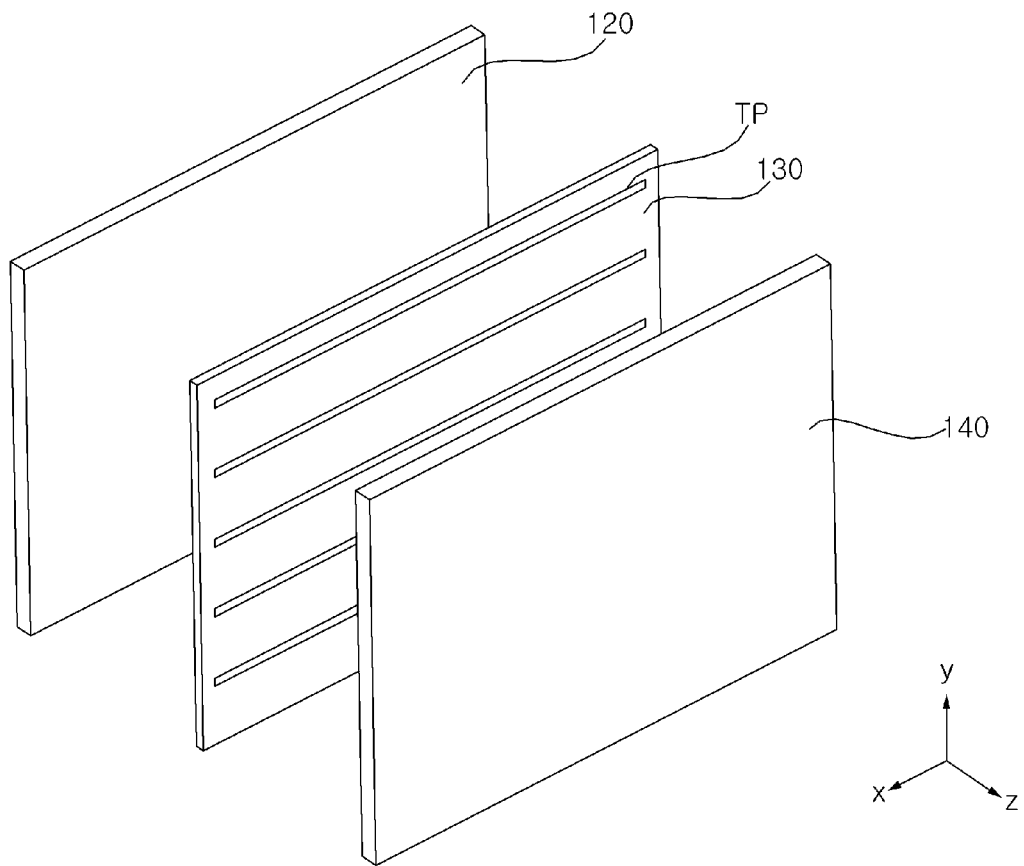

Referring to FIG. 6, the display device 100 may include a plate 130 located between the backlight unit 120 and the module cover 140. Here, the module cover 140 may be referred to as a frame.

The plate 130 may be coupled or attached to the front surface of the module cover 140. The plate 130 may absorb heat generated in the backlight unit 120 and/or heat generated in the PCB 160 (refer to FIG. 12) coupled to the module cover 140 during operation of the display device 100. The heat absorbed by the plate 130 may be evenly distributed along the plate 130.

Accordingly, a local hot spot can be prevented from being generated in the display panel 110 by a heat generated in the backlight unit 120 and/or the PCB 160. Here, the plate 130 may be referred to as a heatsink.

For example, the plate 130 may be screw-coupled to the module cover 140 through a screw (not shown). For example, the plate 130 may be attached to the module cover 140 through a double-sided tape (TP).

Figure 7:
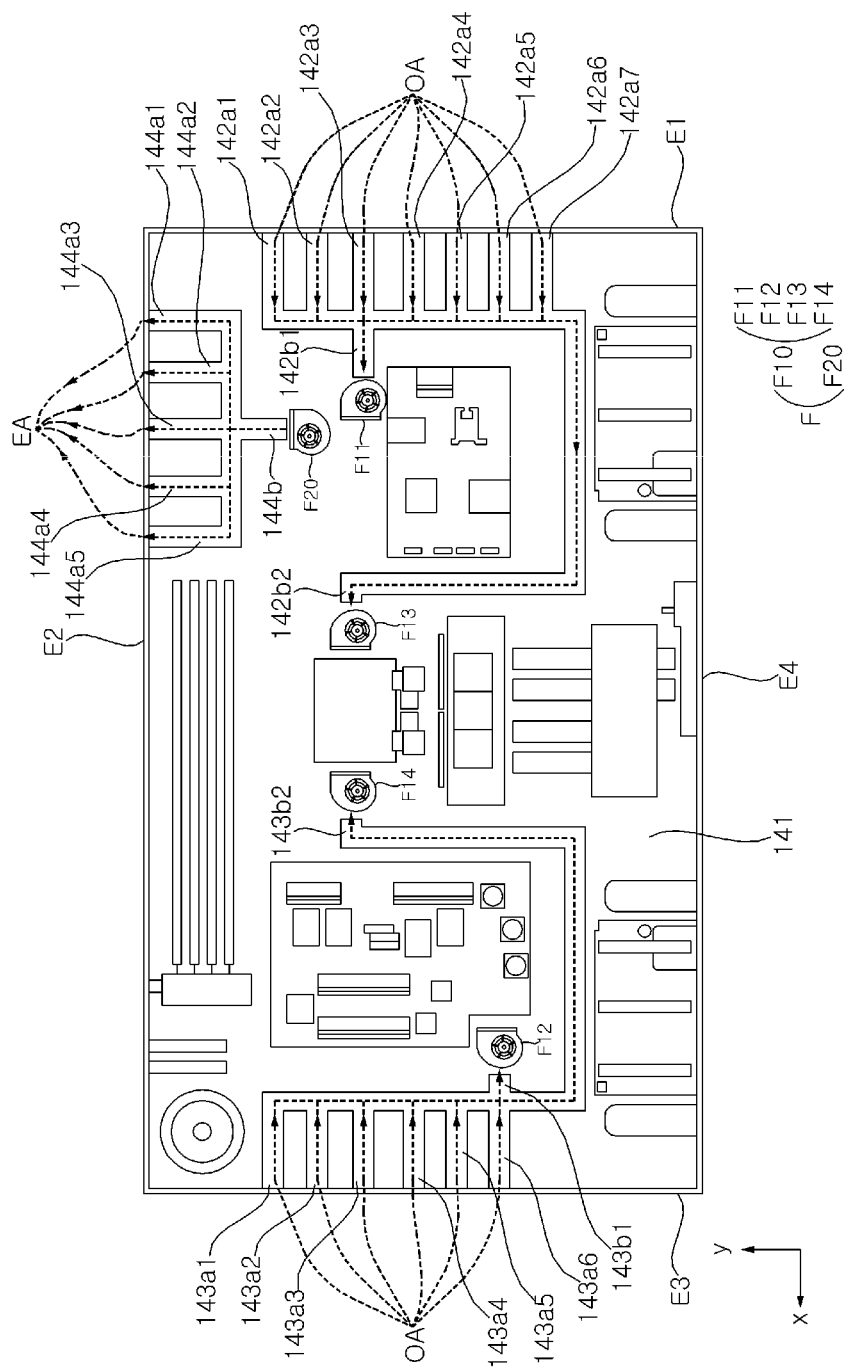

Referring to FIG. 7, the module cover 140 may be formed in a rectangular frame as a whole. That is, the module cover 140 may include four edges. Specifically, the module cover 140 may include a first edge E1 corresponding to the right side, a second edge E2 corresponding to the upper side, a third edge E3 corresponding to the left side, and a fourth edge E4 corresponding to the lower side.

The module cover 140 may include a body 141 to which the PCB 160 (refer to FIG. 12) is coupled, and an air tunnel (142: 142a1, 142a2, 14a3, 142a4, 142a5, 142a6, 142a7, 142b1, 142b2)(143: 143a1, 143a2, 143a3, 143a4, 143a5, 143a6, 143b1, 143b2)(144: 144a1, 144a2, 144a3, 144a4, 144a5, 144b). Here, the PCB 160 may be referred to as a board. In addition, the PCB 160 may be coupled to the module cover 140 between the module cover 140 and the back cover 150, and a plurality of electronic elements may be located therein.

A fan (F: F10, F20) as well as the PCB 160 may be coupled to the body 141. Here, the fan F may be adjacent to the PCB 160, and may cause a flow of air. A portion of the body 141 in which the PCB 160 and/or the fan F is installed may be formed to be flat and may be referred to as a flat plate.

The air tunnel 142, 143, 144 may be formed in the body 141, and provide a flow path P, through which air flowing by the fan F is sucked or discharged, formed therein. That is, the module cover 140 may provide not only an installation space for the PCB 160 and the fan F, but also a flow path of flowing air to remove heat generated in the operation of the display device 100. Here, the air tunnel 142, 143, 144 may be referred to as a duct, an air duct, or a forming portion.

In addition, the air tunnel 142, 143, 144 may be located so as not to overlap the PCB 160 and the fan F in the front-rear direction FR. Meanwhile, the air tunnel 142, 143, 144 may be formed in a recessed shape as described below to improve the bending rigidity and/or torsional rigidity of the module cover 140.

The position of the fan F and the air tunnel 142, 143, 144 may be determined in consideration of the position of the PCB 160 on the body 141 and the degree of heat generation. For example, the air tunnel 142, 143, 144 may include an intake tunnel 142, 143 adjacent to the first edge E1 and the third edge E3, and an exhaust tunnel 144 adjacent to the fourth edge E4.

The intake tunnel 142, 143 may provide an intake flow path P10 through which air sucked to the inside of the display device 100 flows according to the operation of the fan F. The exhaust tunnel 144 may provide an exhaust flow path P20 through which air discharged to the outside of the display device 100 flows according to the operation of the fan F.

Accordingly, the air sucked to the inside of the display device 100 along the intake tunnel 142, 143 may be heated by a heat generated in a heating element of the display device 100 including the PCB 160 and then may be discharged to the outside of the display device 100 along the exhaust tunnel 144. Accordingly, the heating element of the display device 100 may be cooled.

Furthermore, in consideration of the characteristic that a relatively high temperature fluid moves upwards than a relatively low temperature fluid, the exhaust tunnel 144 is preferably located above the intake tunnel 142, 143.

Meanwhile, the air tunnel 142, 143, 144 may have one side and the other side that are opened, and the flow path (P: P10, P20) may be formed between the one side and the other side of the air tunnel 142, 143, 144. In addition, the flow path P may be formed between the plate 130 and the air tunnel 142, 143, 144, which will be described in more detail later.

Figure 8:
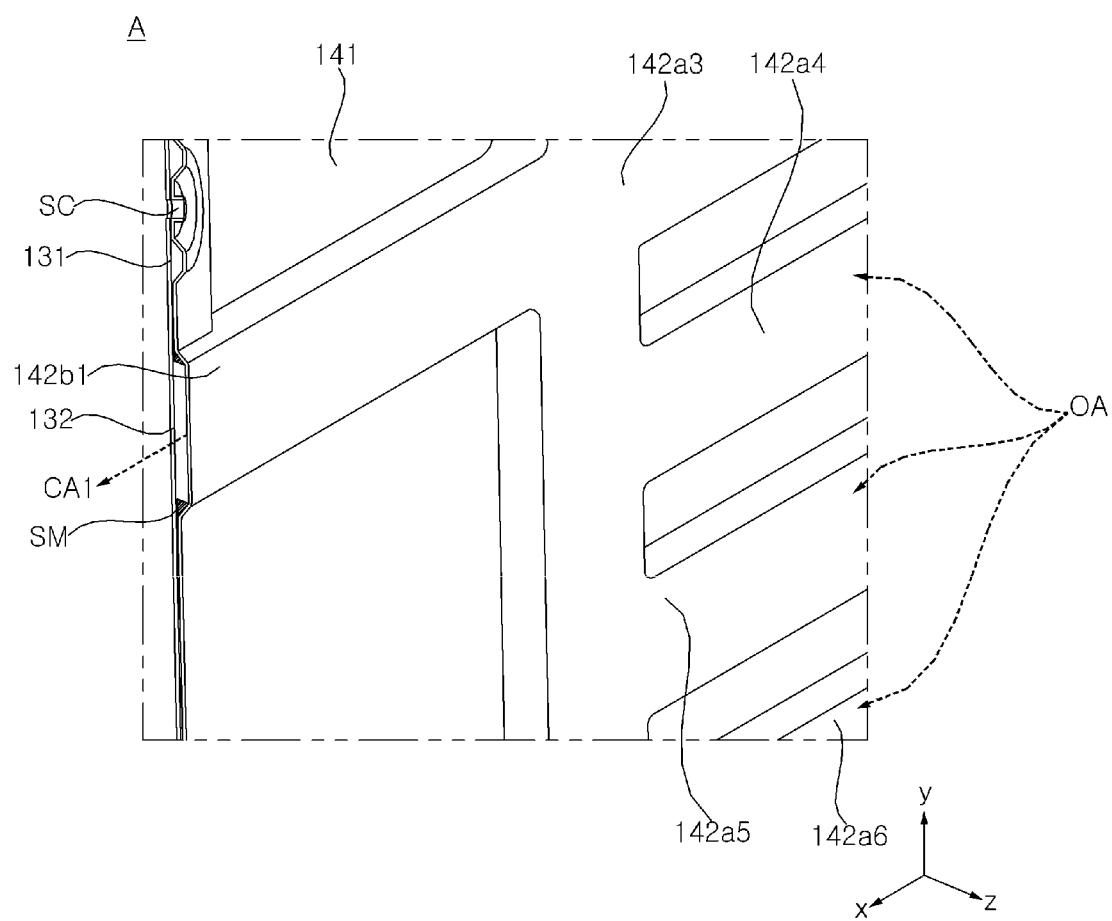

Referring to FIGS. 7 and 8, the intake tunnel 142, 143 may include a first intake tunnel 142 adjacent to the first edge E1. In this case, right and left sides of the first intake tunnel 142 are opened, and a first intake flow path P11 of the intake flow path P10 may be formed between the right and left sides of the first intake tunnel 142.

The plate 130 may include a first part 131 and a second part 132. The first part 131 may contact the body 141. For example, the first part 131 may be coupled to the body 141 through a screw SC. In this case, the rear surface of the first part 131 and the front surface of the body 141 may be in close contact with each other. The second part 132 may face the first intake tunnel 142. At this time, the first intake tunnel 142 may be formed by being recessed in the rearward direction from the body 141. Accordingly, the first intake flow path P11 may be formed between the second part 132 and the first intake tunnel 142.

The first intake tunnel 142 may include a first outer intake tunnel 142a and a first inner intake tunnel 142b. In this case, the first outer intake tunnel 142a may include a plurality of first outer intake tunnels 142a1, 142a2, 142a(n−1), 142an spaced apart from each other. For example, seven first outer intake tunnels 142a may be provided.

Outdoor air OA may be sucked into one end of each of the plurality of first outer intake tunnels 142a. One end of each of the plurality of first outer intake tunnels 142a is adjacent to the first edge E1, and may be communicated with the outside of the display device 100 through a first suction port 151a (refer to FIG. 2) formed in the back cover 150.

The first inner intake tunnel (142b: 142b1, 142b2) may communicate with at least some of the plurality of first outer intake tunnels 142a. In this case, the outdoor air OA flowed into each of the plurality of first outer intake tunnels 142a is joined in the first inner intake tunnel 142b and may be provided as cooling air CA1 to the fan F described later.

Thus, the first intake tunnel 142 may be provided as multiple tunnels. In comparison with this, when it is provided with a single tunnel, the size of the tunnel becomes large to secure a certain level of air flow or higher. Accordingly, it may be difficult to dispose parts or wires in the module cover 140. On the other hand, when it is provided with multiple tunnels, there is an advantage in that it is possible to easily dispose parts or wires in the module cover 140 by utilizing a space between individual tunnels, while securing a certain level of air flow or higher through an individual tunnel of relatively small size.

Figure 9:
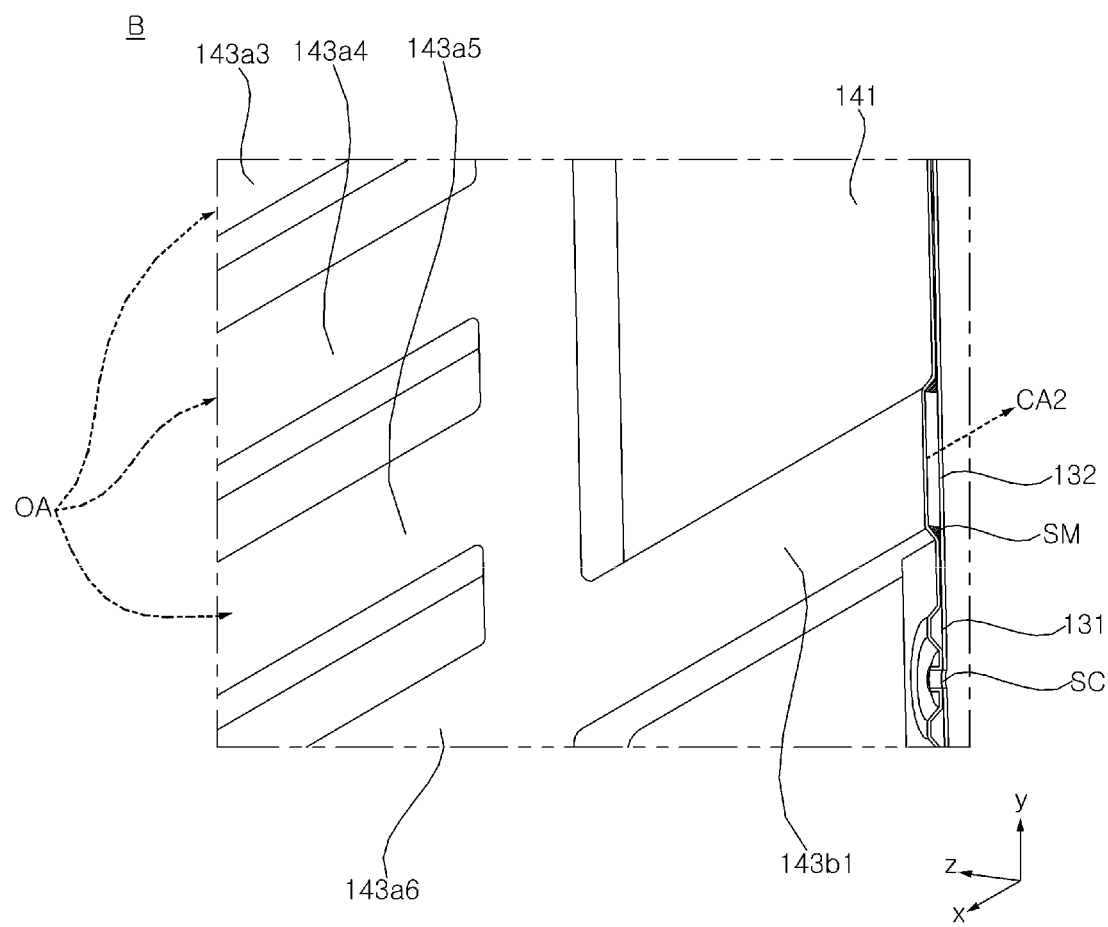

Referring to FIGS. 7 and 9, the intake tunnel 142, 143 may include a second intake tunnel 143 adjacent to the third edge E3. In this case, left and right sides of the second intake tunnel 143 may be opened, and a second intake flow path P12 of the intake flow path P10 may be formed between the left and right sides of the second intake tunnel 143.

The first part 131 of the plate 130 may contact the front surface of the body 141, and the second part 132 of the plate 130 may face the second intake tunnel 143. At this time, the second intake tunnel 143 may be formed by being recessed in the rearward direction from the body 141. Accordingly, the second intake flow path P12 may be formed between the second part 132 and the second intake tunnel 143.

The second intake tunnel 143 may include a second outer intake tunnel 143a and a second inner intake tunnel 143b. In this case, the second outer intake tunnel 143a may include a plurality of second outer intake tunnels 143a1, 143a2, 143a(n−1), 143an that are spaced apart from each other. For example, six second outer intake tunnels 143a may be provided.

Outdoor air OA may be sucked into one end of each of the plurality of second outer intake tunnels 143a. One end of each of the plurality of second outer intake tunnels 143a is adjacent to the third edge E3, and may be communicated with the outside of the display device 100 through a second suction port 151*b* (refer to FIG. 2) formed in the back cover 150.

The second inner intake tunnel (143*b*: 143*b*1, 143*b*2) may communicate with at least some of the plurality of second outer intake tunnels 143*a*. In this case, the outdoor air OA flowed into each of the plurality of second outer intake tunnels 143*a* is joined in the second inner intake tunnel 143*b* and may be provided as cooling air CA2 to the fan F described later.

Thus, the second intake tunnel 143 may be provided as multiple tunnels. In comparison with this, when it is provided with a single tunnel, the size of the tunnel becomes large to secure a certain level of air flow or higher. Accordingly, it may be difficult to dispose parts or wires in the module cover 140. On the other hand, when it is provided with multiple tunnels, there is an advantage in that it is possible to easily dispose parts or wires in the module cover 140 by utilizing a space between individual tunnels, while securing a certain level of air flow or higher through an individual tunnel of relatively small size.

Figure 10:
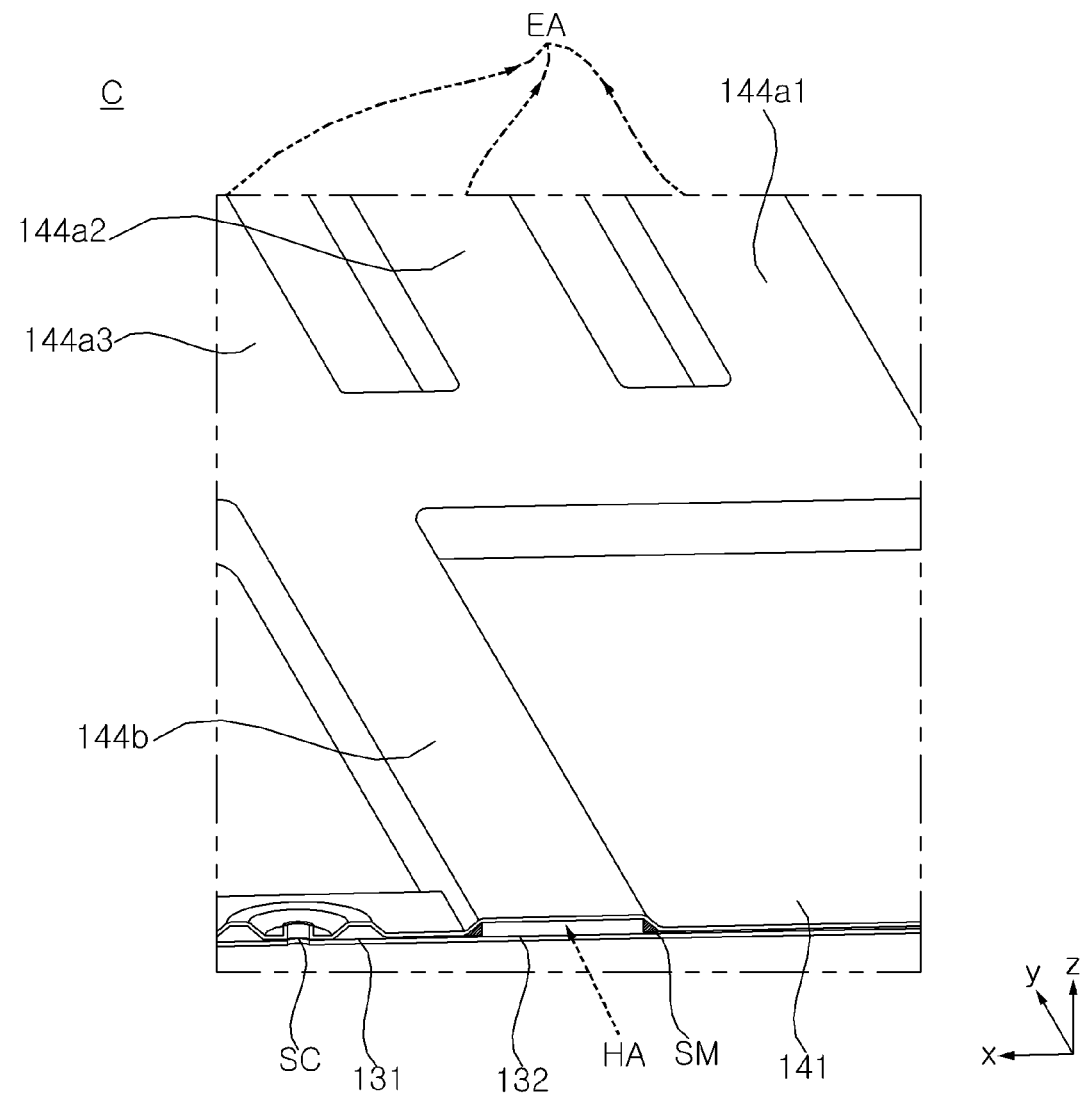

Referring to FIGS. 7 and 10, the exhaust tunnel 144 may be adjacent to the second edge E2. In this case, upper and lower sides of the exhaust tunnel 144 are opened, and the exhaust flow path P20 may be formed between the upper and lower sides of the exhaust tunnel 144.

The first part 131 of the plate 130 may contact the front surface of the body 141, and the second part 132 of the plate 130 may face the exhaust tunnel 144. At this time, the exhaust tunnel 144 may be formed by being recessed in the rearward direction from the body 141. Accordingly, the exhaust flow path P20 may be formed between the second part 132 and the exhaust tunnel 144.

The exhaust tunnel 144 may include an outer exhaust tunnel 144*a* and an inner exhaust tunnel 144*b*. In this case, the outer exhaust tunnel 144*a* may include a plurality of outer exhaust tunnels 144*a*1, 144*a*2, 144*a*(*n*−1), 144*an* that are spaced apart from each other. For example, five outer exhaust tunnels 144*a* may be provided.

Exhausted air EA may be discharged from one end of each of the plurality of outer exhaust tunnel 144*a*. One end of each of the plurality of outer exhaust tunnel 144*a* is adjacent to the second edge E2, and may be communicated with the outside of the display device 100 through a discharge port 152 (refer to FIG. 2) formed in the back cover 150.

The inner exhaust tunnel 144*b* may communicate with at least some of the plurality of outer exhaust tunnel 144*a*. At this time, heating air HA, which is heated by a heating element installed on the module cover 140 such as the PCB 160 after being sucked in through the first intake tunnel 142 or the second intake tunnel 143, may flow into the inner exhaust tunnel 144*b*. In this case, the heating air HA flowed into the inner exhaust tunnel 144*b* according to the operation of the fan F may be branched into a plurality of outer exhaust tunnels 144*a* and discharged as an exhaust air EA to the outside.

Thus, the exhaust tunnel 144 may be provided as multiple tunnels. In comparison with this, when it is provided with a single tunnel, the size of the tunnel becomes large to secure a certain level of air flow or higher. Accordingly, it may be difficult to dispose parts or wires in the module cover 140. On the other hand, when it is provided with multiple tunnels, there is an advantage in that it is possible to easily dispose parts or wires in the module cover 140 by utilizing a space between individual tunnels, while securing a certain level of air flow or higher through an individual tunnel of relatively small size.

Referring back to FIGS. 8 to 10, the display device 100 may include a sealing material SM that prevents the air flowing by the fan F from deviating from the flow path P and leaking to between the first part 131 and the body 141. For example, the sealing material SM may be located between the second part 132 and the air tunnel 142, 143, 144, which is adjacent to the first part 131. For example, the sealing material SM may include a material such as rubber or synthetic resin.

Figure 11:
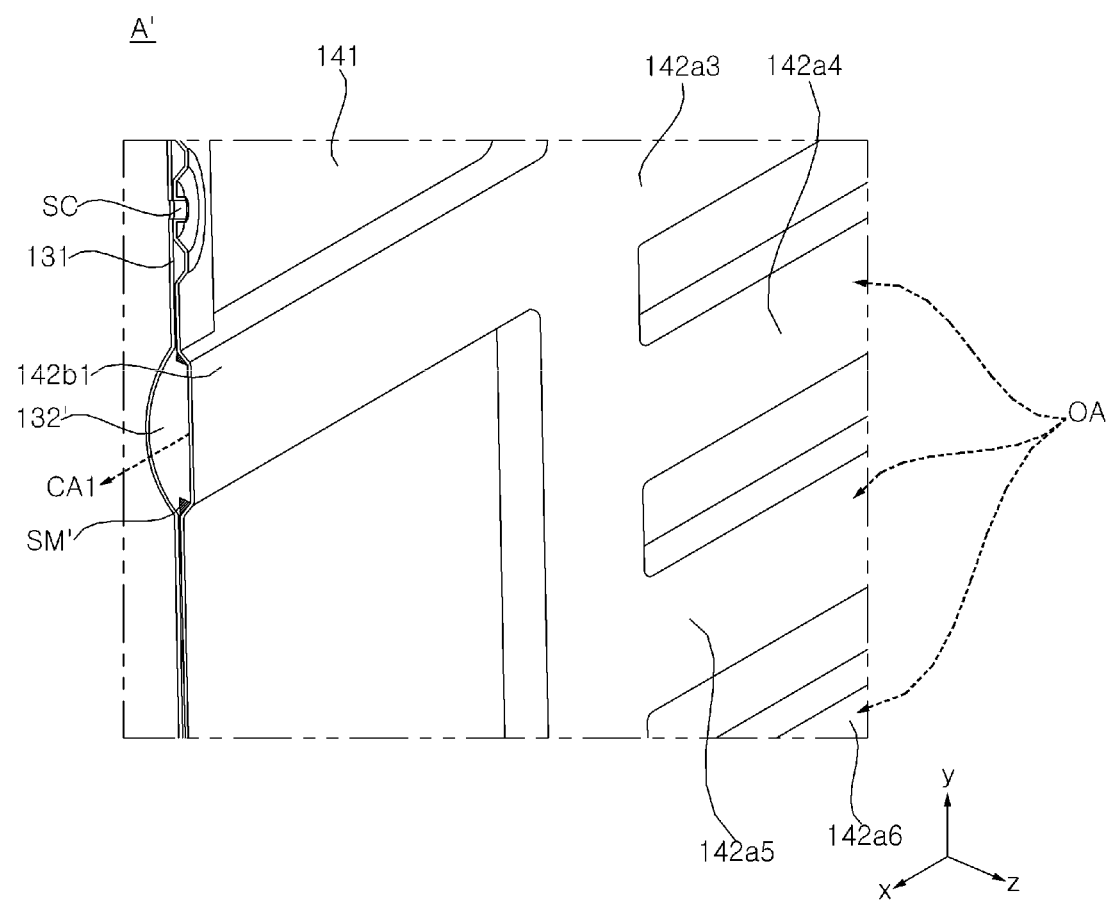

Referring to FIG. 11, the second part 132' may be formed while being recessed in the forward direction from the first part 131. That is, a space between the second part 132' and the air tunnel 142, 143, 144 is increased to further widen the flow path P.

Figure 12:
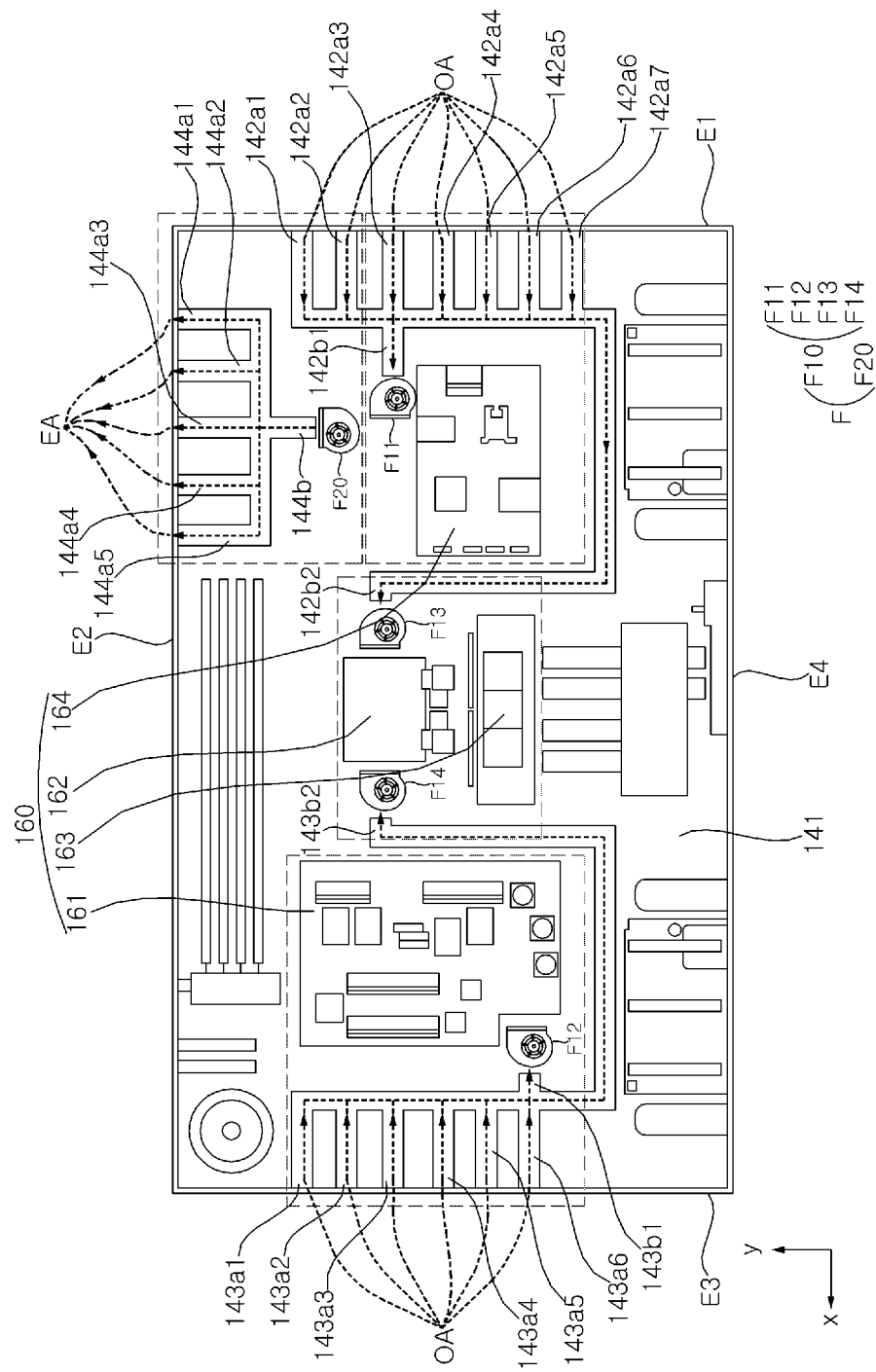

Accordingly, the amount of flowing air is increased according to the operation of the fan F, which may be advantageous in cooling the heating element of the display device 100 including the PCB 160 (refer to FIG. 12).

Referring to FIG. 12, a plurality of PCBs 160 may be coupled to the body 141 of the module cover 140. The PCB 160 generates heat according to its operation, and the generated heat may increase the temperature of each component of the display device 100, in particular, the temperature of the display panel 110, thereby reducing performance.

For example, the PCB 160 may include a power supply board 161 for supplying power to each component of the display device 1, a Frame Rate Control (FRC) board 162, a timing controller board 163 for providing an image signal to the display panel 110, and a main board 164 for controlling each component of the display device 1. A plurality of PCBs 160 may be electrically connected to each other, and connected to each component of the display device 100.

Hereinafter, for a brief description, the power supply board 161, the FRC board 162, the timing controller board 163, and the main board 164 will be described as examples of the PCB 160 that is a cooling target, but the PCB 160 that can be applied to the present disclosure is not limited thereto.

The fan F may cause a flow of air to remove heat generated in the PCB 160. Accordingly, the fan F is preferably located adjacent to the PCB 160 that is a cooling target among the plurality of PCBs 160. In addition, the fan F may include an inflow port Fa into which air passing through the flow path P flows, and a discharge port Fb through which air passing through the inflow port Fa is discharged.

A plurality of fans F may be provided. The plurality of fans F may include an intake fan F10 and an exhaust fan F20. An inflow port F10*a* of the intake fan F10 may be adjacent to one end of the inner intake tunnel (142*b*: 142*b*1, 142*b*2)(143*b*: 143*b*1, 143*b*2), so that the cooling air (CA: CA1, CA2) passing through the inner intake tunnel 142*b*, 143*b* may flow into. A discharge port F20*b* of the exhaust fan F20 may be adjacent to one end of the inner exhaust tunnel 144*b*, so that the heating air HA flowing into the inner exhaust tunnel 144*b* may be discharged.

Meanwhile, the aforementioned first inner intake tunnel 142*b* may be provided in plurality. For example, one end of each of the first inner intake tunnels 142*b* may include a first short intake tunnel 142*b*1 and a first long intake tunnel 142*b*2 that are spaced apart from each other. In this case, the length of the first short intake tunnel 142*b*1 may be shorter than the length of the first long intake tunnel 142*b*2. Accordingly, the first short intake tunnel 142*b*1 may be suitable for providing air for cooling the PCB 160 located relatively close to the edge of the module cover 140. In addition, the first long intake tunnel 142*b*2 may be suitable for providing air for cooling the PCB 160 located relatively far from the edge of the module cover 140.

Meanwhile, the aforementioned second inner intake tunnel 143b may be provided in plurality. For example, one end of each of the second inner intake tunnels 143b may include a second short intake tunnel 143b1 and a second long intake tunnel 143b2 that are spaced apart from each other. In this case, the length of the second short intake tunnel 143b1 may be shorter than the length of the second long intake tunnel 143b2. Accordingly, the second short intake tunnel 143b1 may be suitable for providing air for cooling the PCB 160 located relatively close to the edge of the module cover 140. In addition, the second long intake tunnel 143b2 may be suitable for providing air for cooling the PCB 160 located relatively far from the edge of the module cover 140.

Figure 13:
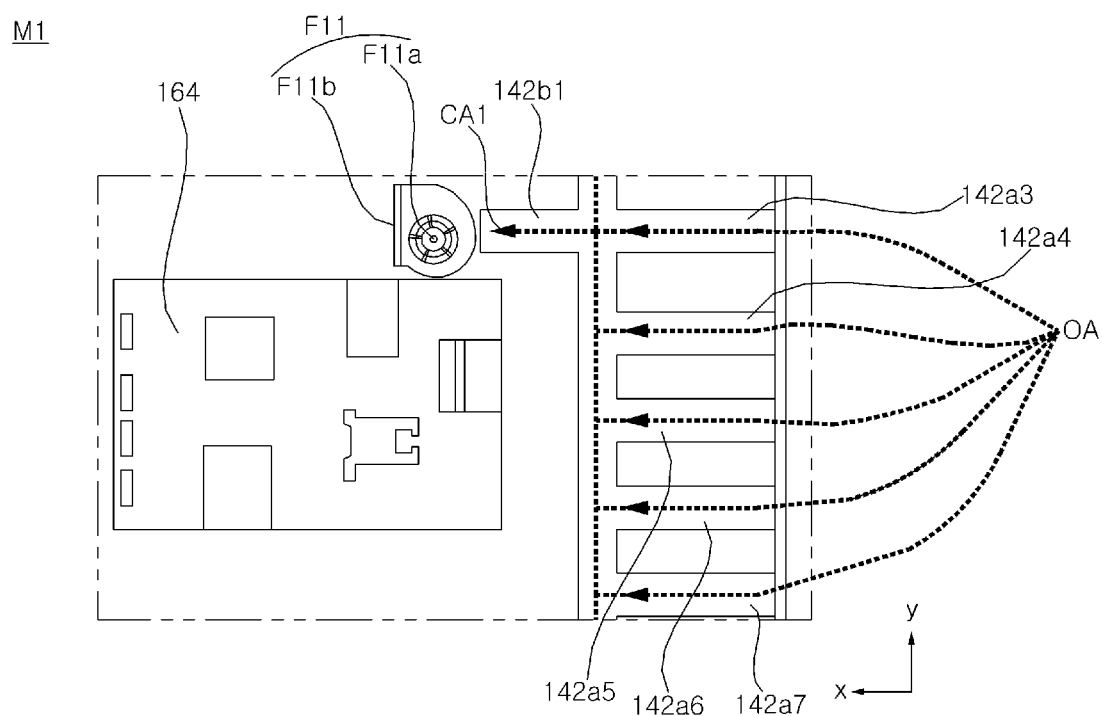

Referring to FIGS. 12 and 13, the intake fan F10 may include a first intake fan F11 coupled to the body 141 at a position adjacent to the main board 164. In this case, an inflow port F11a of the first intake fan F11 may be adjacent to one end of the first short intake tunnel 142b1. For example, the inflow port F11a of the first intake fan F11 may be spaced apart from the back cover 150.

In this case, the cooling air CA1 passing through the first short intake tunnel 142b1 may flow into the inflow port F11a of the first intake fan F11 and be discharged from the discharge port F11b. Accordingly, the cooling air CA1 may flow to the main board 164 and be heated by receiving heat energy from the main board 164, and the main board 164 may be cooled.

Figure 14:
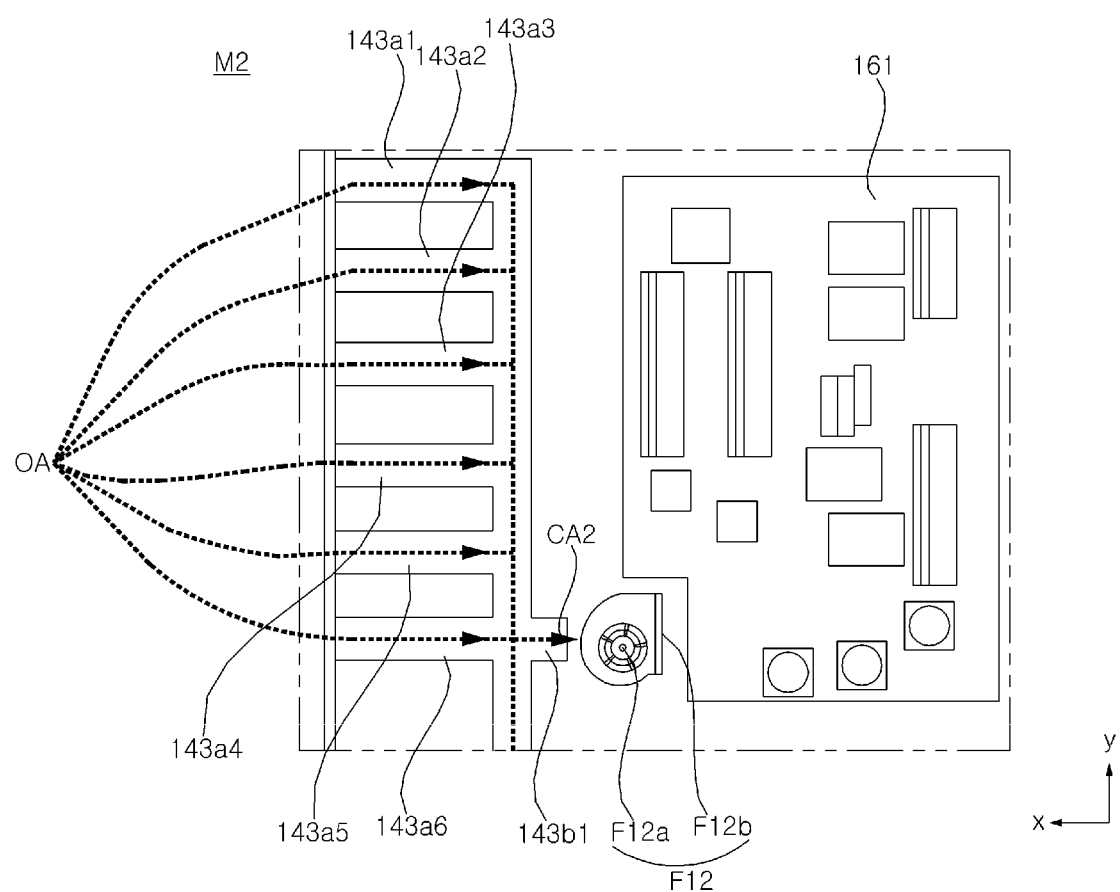

Referring to FIGS. 12 and 14, the intake fan F10 may include a second intake fan F12 coupled to the body 141 at a position adjacent to the power supply board 161. In this case, an inflow port F12a of the second intake fan F12 may be adjacent to one end of the second short intake tunnel 143b1. For example, the inflow port F12a of the first intake fan F12 may be spaced apart from the back cover 150.

In this case, the cooling air CA2 passing through the second short intake tunnel 143b1 may flow into the inflow port F12a of the second intake fan F12 and be discharged from the discharge port F12b. Accordingly, the cooling air CA2 may flow to the power supply board 161 and be heated by receiving heat energy from the power supply board 161, and the power supply board 161 may be cooled.

Figure 15:
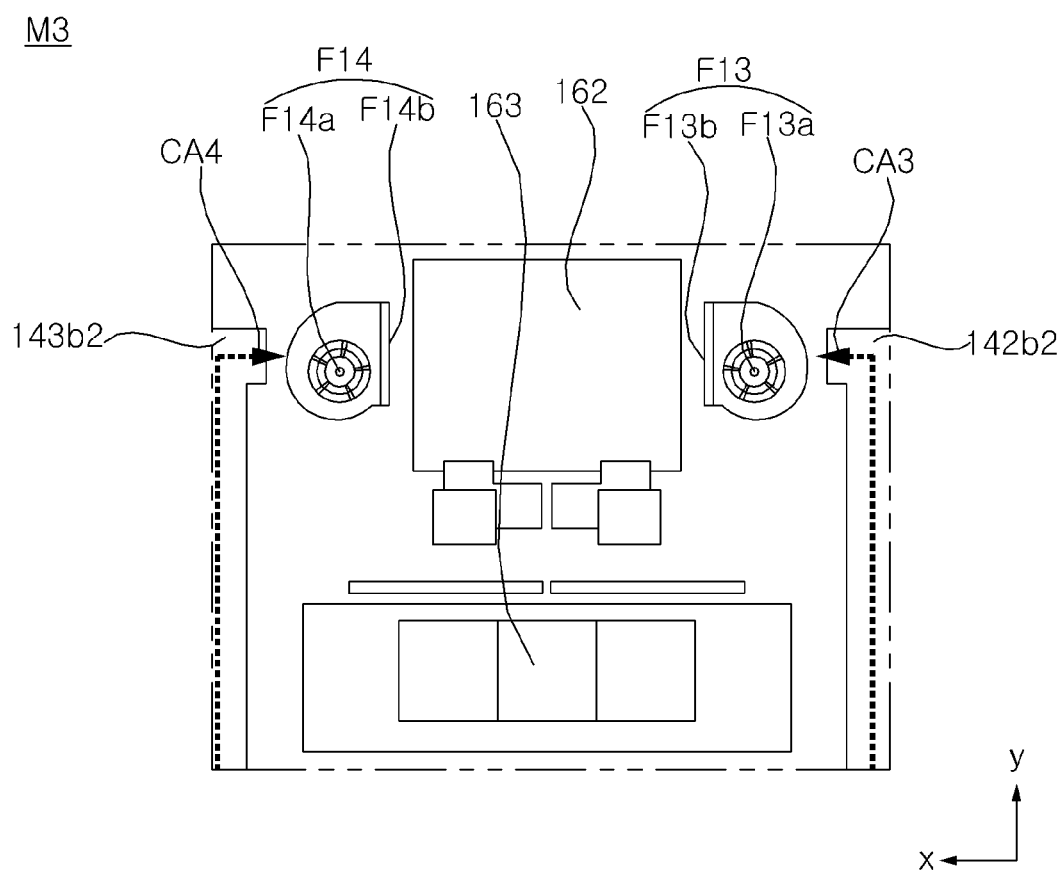

Referring to FIGS. 12 and 15, the intake fan F10 may include a third intake fan F13 and a fourth intake fan F14 that are coupled to the body 141 at a position adjacent to the FRC board 162.

An inflow port F13a of the third intake fan F13 may be adjacent to the first long intake tunnel 142b2. For example, the inflow port F13a of the third intake fan F13 may be spaced apart from the back cover 150. In this case, a cooling air CA3 passing through the first long intake tunnel 142b2 may flow into the inflow port F13a of the third intake fan F13 and be discharged from the discharge port F13b. Accordingly, the cooling air CA3 may flow to the FRC board 162 and be heated by receiving heat energy from the FRC board 162, and the FRC board 162 may be cooled.

Meanwhile, the first long intake tunnel 142b2 may communicate with the first short intake tunnel 142b1. Accordingly, when the first intake fan F11 is operated but the third intake fan F13 is not operated, the outdoor air OA flowed into the first outer intake tunnel 142a may be provided as cooling air CA1 to the inflow port F11a of the first intake fan F11 from the first short intake tunnel 142b1. In addition, when the first intake fan F11 is not operated but the third intake fan F13 is operated, the outdoor air OA flowed into the first outer intake tunnel 142a may be provided as cooling air CA3 to the inflow port F13a of the third intake fan F13 from the first long intake tunnel 142b2.

In addition, when both the first intake fan F11 and the third intake fan F13 are operated, among the outdoor air OA flowed into the first outer intake tunnel 142a, a portion of the outdoor air OA may be provided as cooling air CA1 to the inflow port F11a of the first intake fan F11 from the first short intake tunnel 142b1, and a remaining outdoor air OA may be provided as cooling air CA3 to the inflow port F13a of the third intake fan F13 from the first long intake tunnel 142b2. In this case, the amount of cooling air CA1 provided to the first intake fan F11 and the amount of cooling air CA3 provided to the third intake fan F13 may be adjusted in response to the rotational speeds of the first intake fan F11 and the third intake fan F13.

Accordingly, the main board 164 electrically connected to the first intake fan F11 and the third intake fan F13 adjusts the rotation and the rotation speed of the first intake fan F11 and the third intake fan F13, thereby adjusting the cooling and the degree of supply of cooling air of the main board 164 and the FRC board 162.

The inflow port F14a of the fourth intake fan F14 may be adjacent to the second long intake tunnel 143b2. For example, the inflow port F14a of the fourth intake fan F14 may be spaced apart from the back cover 150. In this case, the cooling air CA4 passing through the second long intake tunnel 143b2 may flow into the inflow port F14a of the fourth intake fan F14 and be discharged from the discharge port F14b. Accordingly, the cooling air CA4 may flow to the FRC board 162 and be heated by receiving heat energy from the FRC board 162, and the FRC board 162 may be cooled.

Meanwhile, the second long intake tunnel 143b2 may communicate with the second short intake tunnel 143b1. Accordingly, when the second intake fan F12 is operated but the fourth intake fan F14 is not operated, the outdoor air OA flowed into the second outer intake tunnel 143a may be provided as cooling air CA2 to the inflow port F12a of the second intake fan F12 from the second short intake tunnel 143b1. In addition, when the second intake fan F12 is not operated but the fourth intake fan F14 is operated, the outdoor air OA flowed into the second outer intake tunnel 143a may be provided as cooling air CA4 to the inflow port F14a of the fourth intake fan F14 from the second long intake tunnel 143b2.

In addition, when both the second intake fan F12 and the fourth intake fan F14 are operated, among the outdoor air OA flowed into the second outer intake tunnel 143a, a portion of the outdoor air OA may be provided as cooling air CA2 to the inflow port F12a of the second intake fan F12 from the second short intake tunnel 143b1, and a remaining outdoor air OA may be provided as cooling air CA4 to the inflow port F14a of the fourth intake fan F14 from the second long intake tunnel 143b2. In this case, the amount of cooling air CA2 provided to the second intake fan F12 and the amount of cooling air CA4 provided to the fourth intake fan F14 may be adjusted in response to the rotational speeds of the second intake fan F12 and the fourth intake fan F14.

Accordingly, the main board 164 electrically connected to the second intake fan F12 and the fourth intake fan F14 adjusts the rotation and the rotation speed of the second intake fan F12 and the fourth intake fan F14, thereby adjusting the cooling and the degree of supply of cooling air of the power supply board 161 and the FRC board 162.

Figure 16:
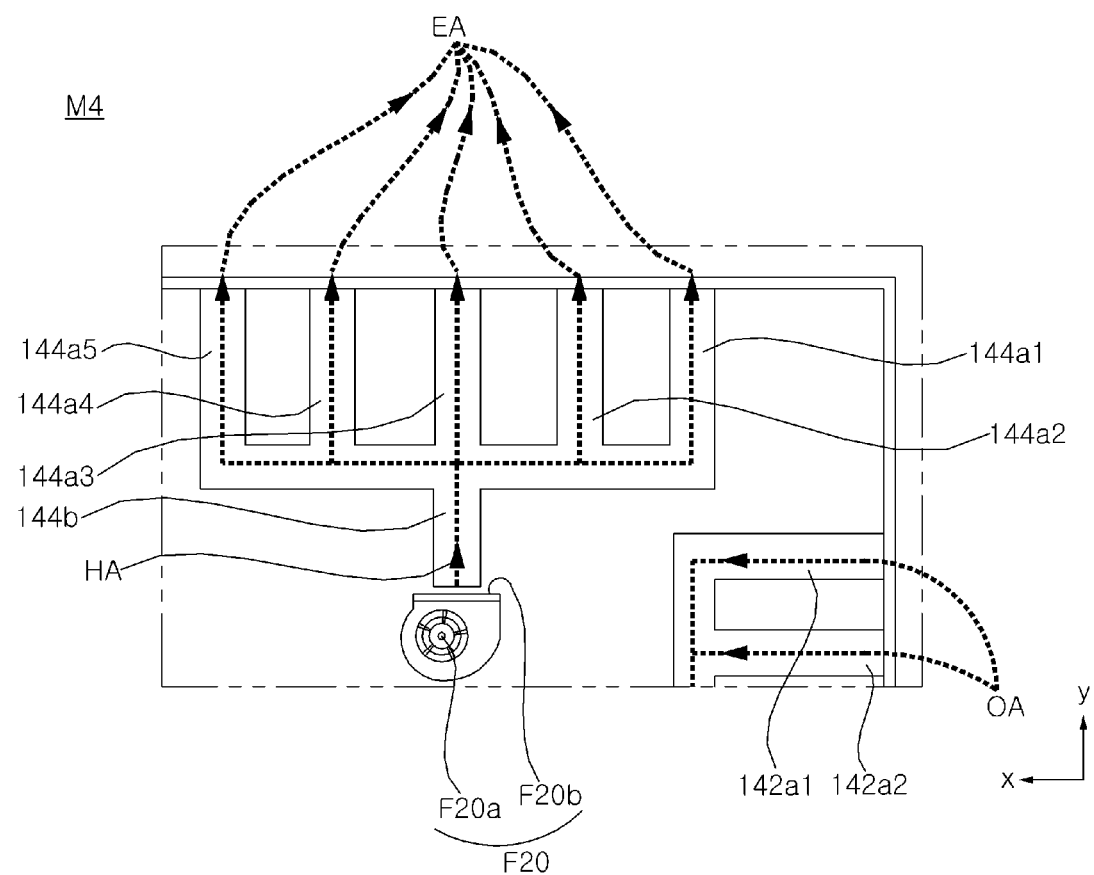

Referring to FIGS. 12 and 16, the exhaust fan F20 may be coupled to the body 141 at a position adjacent to the first intake fan F11. In this case, the discharge port F20b of the exhaust fan F20 may be adjacent to one end of the inner exhaust tunnel 144*b*. For example, the inflow port F20*a* of the exhaust fan F20 may be spaced apart from the back cover 150. Here, the exhaust fan F20 is located adjacent to the first intake fan F11 so as to achieve a smooth cooling of the main board 164 which generates a relatively large amount of heat, but the position of the exhaust fan F20 is not limited thereto.

In this case, the heating air HA, which flows to the PCB 160 according to the operation of the intake fan F10 and has an increased temperature, may flow into the inflow port F20*a* of the exhaust fan F20 and be discharged from the discharge port F20*b*. Thus, the heating air HA may be discharged to the outside through the inner exhaust tunnel 144*b* and the outer exhaust tunnel 144*a*, thereby preventing the heating air HA from being stagnant inside the display device 100.

As described above, the intake fan F10 and the exhaust fan F20 may generate intake/exhaust flow for cooling the PCB 160. Meanwhile, a plurality of exhaust fans F20 may be provided to allow the exhaust to be performed more smoothly.

According to an aspect of the present disclosure, provided is a display device including: a display panel; a module cover located at a rear of the display panel; a plate located between the display panel and the module cover; a back cover covering a back of the module cover; a PCB coupled to the module cover between the module cover and the back cover, and on which a plurality of electronic elements are located; and a fan adjacent to the PCB, and causing a flow of air, wherein the module cover includes: a body to which the fan is coupled; and an air tunnel formed at the body, and providing a flow path through which the air flowed by the fan is sucked in or discharged.

In addition, according to another aspect of the present disclosure, one side and the other side of the air tunnel may be opened, the flow path may be formed between one side of the air tunnel and the other side of the air tunnel.

In addition, according to another aspect of the present disclosure, the plate may further include: a first part in contact with the body; and a second part facing the air tunnel, wherein the air tunnel may be formed by being recessed in a rearward direction from the body, wherein the flow path may be formed between the second part and the air tunnel.

In addition, according to another aspect of the present disclosure, the second part may be formed while being recessed in a forward direction from the first part.

In addition, according to another aspect of the present disclosure, the fan may further include: an inflow port through which the air passing through the flow path flows into; and a discharge port through which the air passing through the inflow port is discharged, wherein the air tunnel may further include: an intake tunnel that provides an intake flow path through which the air flowed into the inflow port flows therein; and an exhaust tunnel that provides an exhaust flow path through which the air discharged from the discharge port flows therein.

In addition, according to another aspect of the present disclosure, the intake tunnel may further include: a plurality of outer intake tunnels which respectively have one end though which air is sucked, and are spaced apart from each other; and an inner intake tunnel which communicates with at least some of the plurality of outer intake tunnels, and which has one end adjacent to the inflow port.

In addition, according to another aspect of the present disclosure, the exhaust tunnel may further include: a plurality of outer exhaust tunnels which respectively have one end though which air is discharged, and are spaced apart from each other; and an inner exhaust tunnel which communicates with at least some of the plurality of outer exhaust tunnels, and which has one end adjacent to the discharge port.

In addition, according to another aspect of the present disclosure, the fans may be provided in plurality, wherein the plurality of fans may further include: an intake fan having an inflow port adjacent to one end of the inner intake tunnel; and an exhaust fan having a discharge port adjacent to one end of the inner exhaust tunnel.

In addition, according to another aspect of the present disclosure, the exhaust tunnel may be located in an upper side than the intake tunnel.

In addition, according to another aspect of the present disclosure, the air tunnel may be located so as not to overlap with the PCB and the fan in a front-rear direction.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
   a display panel;
   a module cover located at a rear of the display panel;
   a plate located between the display panel and the module cover;
   a back cover covering a back of the module cover;
   a printed circuit board coupled to the module cover between the module cover and the back cover, and on which a plurality of electronic elements are located; and
   a fan adjacent to the printed circuit board, and causing a flow of air,
   wherein the module cover comprises:
      a body to which the fan is coupled; and
      an air tunnel formed at the body, and providing a flow path through which the air flowed by the fan is sucked in or discharged,
   wherein the fan comprises:
      an inflow port through which the air passing through the flow path flows into; and
      a discharge port through which the air passing through the inflow port is discharged,
   wherein the air tunnel comprises an intake tunnel that provides an intake flow path through which the air flowed into the inflow port flows therein, the intake tunnel comprising:

a plurality of outer intake tunnels which respectively have one end though which air is sucked, and are spaced apart from each other; and an inner intake tunnel which communicates with at least some of the plurality of outer intake tunnels, and which has one end adjacent to the inflow port.

2. The display device of claim 1, wherein one side and the other side of the air tunnel are opened, wherein the flow path is formed between one side of the air tunnel and the other side of the air tunnel.

3. The display device of claim 2, wherein the plate further comprises:

a first part in contact with the body; and a second part facing the air tunnel, wherein the air tunnel is formed by being recessed in a rearward direction from the body, wherein the flow path is formed between the second part and the air tunnel.

4. The display device of claim 3, wherein the second part is formed while being recessed in a forward direction from the first part.

5. The display device of claim 1, wherein the air tunnel further comprises:

an exhaust tunnel that provides an exhaust flow path through which the air discharged from the discharge port flows therein.

6. The display device of claim 5, wherein the exhaust tunnel further comprises:

a plurality of outer exhaust tunnels which respectively have one end though which air is discharged, and are spaced apart from each other; and an inner exhaust tunnel which communicates with at least some of the plurality of outer exhaust tunnels, and which has one end adjacent to the discharge port.

7. The display device of claim 6, wherein the fans are provided in plurality, wherein the plurality of fans further comprises:

an intake fan having an inflow port adjacent to one end of the inner intake tunnel; and an exhaust fan having a discharge port adjacent to one end of the inner exhaust tunnel.

8. The display device of claim 5, wherein the exhaust tunnel is located in an upper side than the intake tunnel.

9. The display device of claim 1, wherein the air tunnel is located so as not to overlap with the printed circuit board and the fan in a front-rear direction.

* * * * *